(12) United States Patent
Hayes

(10) Patent No.: US 6,440,212 B1
(45) Date of Patent: Aug. 27, 2002

(54) LOW COST METHOD FOR MAKING THERMOELECTRIC COOLERS

(75) Inventor: Donald J. Hayes, Parker, TX (US)

(73) Assignee: MicroFab Technologies, Inc., Plano, TX (US)

( * ) Notice: Subject to any disclaimer, the term of this patent is extended or adjusted under 35 U.S.C. 154(b) by 38 days.

(21) Appl. No.: 09/794,194

(22) Filed: Feb. 27, 2001

Related U.S. Application Data

(63) Continuation-in-part of application No. 60/185,261, filed on Feb. 28, 2000.

(51) Int. Cl.[7] .............................................. C30B 19/12
(52) U.S. Cl. .......................... 117/54; 117/56; 117/58; 117/63; 117/12; 117/953; 117/954
(58) Field of Search ............................ 117/54, 56, 58, 117/63, 12, 953, 954

(56) References Cited

U.S. PATENT DOCUMENTS

| | | |
|---|---|---|
| 5,193,738 A | 3/1993 | Hayes |
| 5,229,016 A | 7/1993 | Hayes et al. |
| 5,377,902 A | 1/1995 | Hayes |
| 5,415,679 A | 5/1995 | Wallace |
| 5,681,757 A | 10/1997 | Hayes |
| 5,772,106 A | 6/1998 | Ayers et al. |
| 6,015,083 A | 1/2000 | Hayes et al. |
| 6,114,187 A | 9/2000 | Hayes |
| 6,222,242 B1 * | 4/2001 | Konishi et al. ............. 257/467 |
| 6,274,802 B1 * | 8/2001 | Fukuda et al. .............. 136/201 |

FOREIGN PATENT DOCUMENTS

EP          795630          * 9/1997

OTHER PUBLICATIONS

U.S. patent application Ser. No. 09/514,760, Hayes, filed Feb. 28, 2000.

* cited by examiner

*Primary Examiner*—Robert Kunemund
(74) *Attorney, Agent, or Firm*—Locke Liddell & Sapp LLP

(57) ABSTRACT

A process of making thermoelectric coolers by direct printing of n- and p-type semiconductor materials suitable for making thermoelectric coolers is disclosed. Micro Jet Printing of arrays on n and p-type materials belong to conductive site pads on non-conductive substrate and crystalization of these materials in the preferred direction as they cool produces thermoelectric cooler components without the need for sawing and machining operations. A non-conductive top substrate having conductive bonding pads is secured to the tops of the columns n and p-type semiconductor materials thereby forming an electrical and physical bond to make a thermoelectric cooler package.

22 Claims, 5 Drawing Sheets

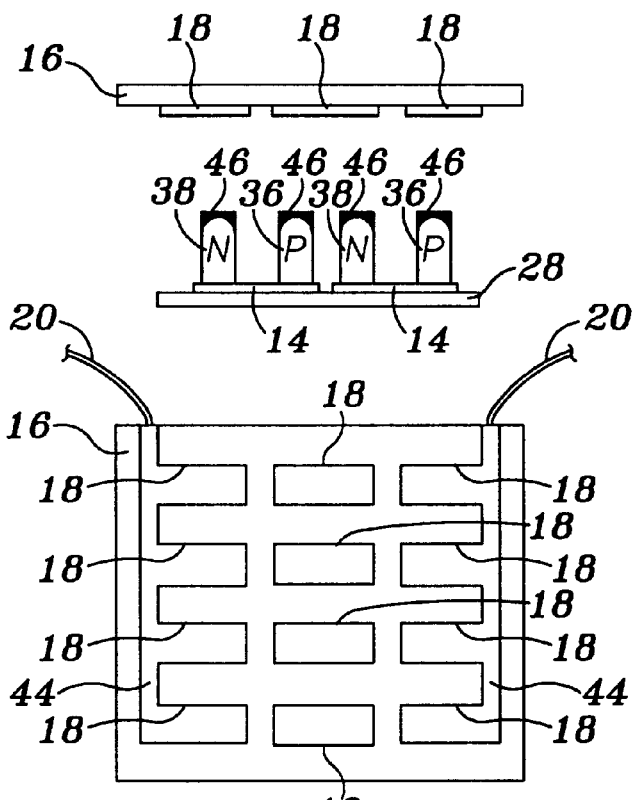
FIG. 5a
FIG. 5b
FIG. 5c
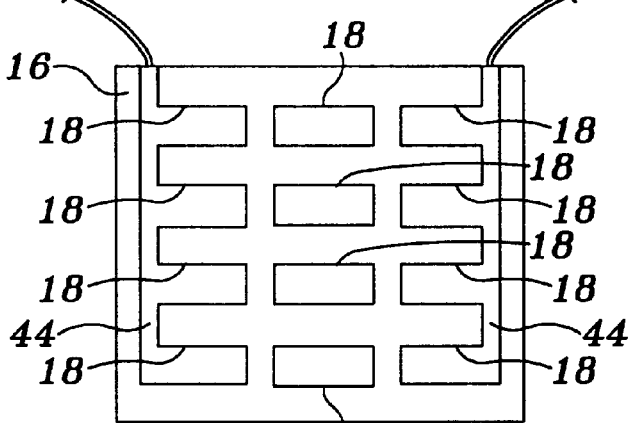
FIG. 5d
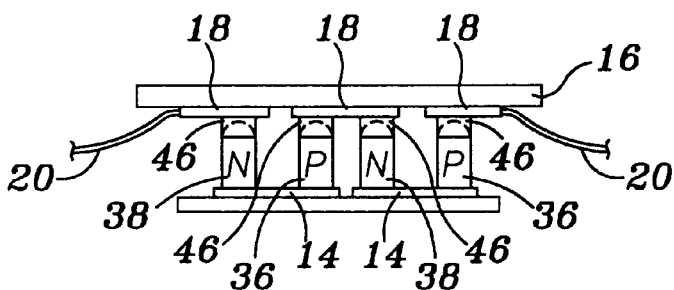
FIG. 5e

LOW COST METHOD FOR MAKING THERMOELECTRIC COOLERS

CROSS REFERENCE TO RELATED APPLICATIONS

This application is a continuation-in-part of Provisional Application No. 60/185,261, filed Feb. 28, 2000 by the same inventor, for which priority benefit is claimed.

BACKGROUND OF THE INVENTION

1. Field of the Invention

This invention relates to direct printing of n and p-type semiconductor materials for use in making thermoelectric coolers.

2. Background of the Prior Art.

Thermoelectric coolers are generally semiconductor devices designed for a medium to low heat pumping capacity requirements. Typical applications include temperature stabilization of bolo meters and ferroelectric detectors, laser diode arrays in fiber optic systems, and for maintaining constant viscosity in ink jet printers. They are generally relatively small devices but nevertheless can generate a temperature differential in the range of 60 degrees Fahrenheit or more. One manufacturer produces square shaped thermoelectric coolers from as small as 4 mm by 4 mm by 2.4 mm high to 13.2 mm by 13.2 mm by 2.2 mm high.

Thermoelectric coolers are typically manufactured by growing single crystals of doped semiconductor materials and then sawing and machining these materials into rectangular shapes with specific crystal orientation, which are then assembled into arrays of n-type and p-type materials. The CRC Handbook of Thermoelectric Coolers edited by D. M. Rowe, CRC Press, Inc., 1995 is a reference on thermoelectric coolers.

Methods of fabrication utilizing the principles of ink-jet printing devices are becoming known in the art. U.S. Pat. No. 6,114,187, Sep. 5, 2000, illustrates the use of an ink-jet printer to prepare a chip scale package which is "bumped" in preparation for making electrical interconnections with pads on a connection surface of the chip. The disclosure of this patent of the same assignee is incorporated herein by reference.

Micro-Jet printing technology, based on ink-jet printing, has been modified in various ways to deposit solder and dielectric polymers in a highly controlled manner on a microscopic scale. Solder and dielectric materials can be applied by the printhead at a high rate of speed controlled by applied voltage pulses at a selected electrical frequency and delay time. This type of printhead is disclosed in U.S. Pat. Nos. 5,193,738, 5,229,016, 5,377,902, 5,643,353 and Patent 5,772,106, Jun. 30, 1998, the disclosures of which are incorporated by reference. The latter U.S. Pat. No. , 5,772, 106, discloses a printhead useful for liquid metals such as solder.

These same devices can be employed to deposit flowable polymeric materials which can be deposited as droplets from a heated printhead of the above references in the manner of U.S. Pat. Nos. 5,441,679, Mar. 12, 1996; U.S. Pat. No. 5,415,679, May 2, 1995 and U.S. Pat. No. 5,707,684, Jan. 13, 1998 also incorporated by reference. Multiple solder jetting printheads can be arranged to deposit solder or organic dielectric materials as indicated in U.S. Pat. No. 5,686,757 incorporated herein by reference.

It would be desirable if the necessary individual n-type and p-type semiconductor materials could be generated from molten materials and deposited directly at the required location and assembled into thermoelectric coolers without sawing and machining operations.

SUMMARY OF THE INVENTION

The present invention discloses a process for fabricating thermoelectric coolers from molten components to produce in situ semiconductor elements which make up thermoelectric coolers. A first substrate is provided having a plurality of spaced apart conductive site pads which comprises the bottom half of a thermoelectric cooler. Molten p-type semiconductor material in a reservoir in communication with a first ejection orifice as held in a digitally driven ejection device and molten n-type semiconductor material having a reservoir in fluid communication with a second ejection orifice is held in a digitally driven ejection device. Because the p-type and n-type semiconductor material is generally molten at an elevated temperature, the digitally driven ejection devices must be capable of holding the molten material in a fluid condition where it can be deposited in droplets, preferably in drop-on-demand mode. The substrate is held at a crystallization temperature which is lower than the freezing temperature of the molten semiconductor materials so that columns of p-type and n-type semiconductor material can be formed on the plurality of spaced apart conductive site pads. A series of droplets of p-type semiconductor material are deposited onto a first conductive site pad on the substrate to freeze it in a column extending away from the first conductive site pad and having a characteristic height terminating at an end. A series of droplets of n-type semiconductor material are deposited onto the first conductive site pad on the substrate to freeze it into a column, spaced from the column of p-type semiconductor material, extending away from the first conductive site pad and having the same characteristic height terminating at an end. The steps are repeated by positioning a second conductive site pad under the first and second ejection orifices and repeating the steps of depositing droplets of p-type semiconductor material and n-type semiconductor material to form separate columns of p-type and n-type semiconductor material which are spaced apart and extending away from the at least a second conductive site pad and having the same characteristic height terminating at their end. Additional columns of p-type and n-type semiconductor material can be formed on any additional conductive site pads until all of the semiconductor elements are formed. A curable or hardenable conductive bonding agent is applied to the ends of the columns of the p-type and n-type semiconductor material. The conductive bonding agent may be a curable conductive epoxy or solder can be used.

A second substrate having a plurality of spaced apart conductive bonding sites including a first conductive bonding site is provided to serve as the top half of the thermoelectric cooler to be produced. These conductive bonding sites have a size and spacing which is similar to that of the conductive site pads, but offset laterally. When the first and second substrates are placed in facing relation, the first conductive bonding site is mated with a column of p-type semiconductor material on the first conductive site pad and the first conductive bonding site is also mated with a column of n-type semiconductor material on the second conductive site pad. This is followed by the step of bonding the mated columns of p-type and n-type semiconductor material in electrical contact with the mated first conductive bonding site to create a package capable of acting as a thermoelectric cooler. Additional bonding sites are mated and bonded similarly with other p-type and n-type elements formed as columns on other conductive site pads on the substrate.

The process may be applied to produce thermoelectric cooler elements from p-type and n-type semiconductor materials having different melting temperatures. The process may be modified in this instance by altering the sequence of steps and depositing the higher freezing temperature semiconductor material before the lower freezing temperature semiconductor material is deposited. The first non-conductive substrate is provided having a plurality of spaced apart conductive site pads. One of p-type or n-type semiconductor material having a higher freezing temperature is held in a digitally driven droplet ejection device having a heated reservoir in fluid communication with a first ejection orifice. The non-conductive substrate is held at a crystallization temperature which is lower than the freezing temperature of the molten semiconductor material having the higher freezing temperature. A column of semiconductor material on each of the plurality of spaced apart conductive site pads on the first non-conductive substrate is formed by depositing droplets of the higher freezing temperature semiconductor material thereon from the first ejection orifice, each column terminating at an end portion and having the same characteristic height.

The other of the molten n-type or p-type semiconductor material is held in a digitally driven droplet ejection device having a heated reservoir in fluid communication with a second ejection orifice. The first non-conductive substrate is held at a crystallization temperature which is lower than the freezing temperature of the other of said n-type or p-type semiconductor material. A separate column of semiconductor material is formed by depositing droplets of the lower freezing temperature semiconductor material on each of the plurality of spaced apart conductive site pads on the first non-conductive substrate wherein each column is a separate column terminating at an end portion and having the same characteristic height as the already formed columns of semiconductor material. A bonding agent is applied to the ends of the columns of p-type and n-type semiconductor material and they are placed in facing relation with one of a plurality of conductive bonding sites on a second non-conductive substrate wherein one or more conductive bonding sites are mated with a column of one of the types of semiconductor material on one conductive site pad and another of the types of semiconductor material on a different conductive site pad. Other mated columns of p-type and n-type semiconductor material are bonded in electrical and physical contact with ones of the plurality of conductive bonding sites to create a package capable of acting as a thermoelectric cooler.

The invention makes it possible to produce in situ columns of n-type and p-type semiconductor materials directly from molten material to make thermoelectric coolers. The process is digitally controlled by a computer controlled system that in combination with an X-Y stage is programmed to move the conductive site pads relative to the orifices from which the molten material is ejected after a columnar element is formed. The substrate is indexed to the next conductive site pad where an additional column of semiconductor material is formed until a complete array of conductive site pads each having the appropriate p-type and n-type columns of semiconductor elements is prepared. The cost of sawing and machining individual pieces is eliminated, waste is eliminated and the process is well suited for automation.

BRIEF DESCRIPTION OF THE DRAWINGS

FIG. 5a is a schematic side view of a second non-conductive substrate of the invention having a plurality of spaced apart conductive bonding sites;

FIG. 5b is a schematic side view of a micro-jet printed first non-conductive substrate having a plurality of n-type and p-type semiconductor materials printed in columns of characteristic and equal height and a bonding agent on top of the ends of the columns mated in facing relation with the second substrate of FIG. 5a;

FIG. 5c is a schematic plan view drawing of the top substrate of FIG. 5a, showing the array of conductive bonding sites;

FIG. 5d is a schematic plan view of a plurality of the printed p-type and n-type semiconductor material columns of FIG. 5a sharing an array of conductive site pads each having a column of printed n-type and a column of printed p-type semiconductor material;

FIG. 5e is an end view of the final assembly of FIGS. 5a–5d illustrating a completed thermoelectric cooler made by the process of the invention.

DETAILED DESCRIPTION OF THE PREFERRED EMBODIMENT

Figure 1:
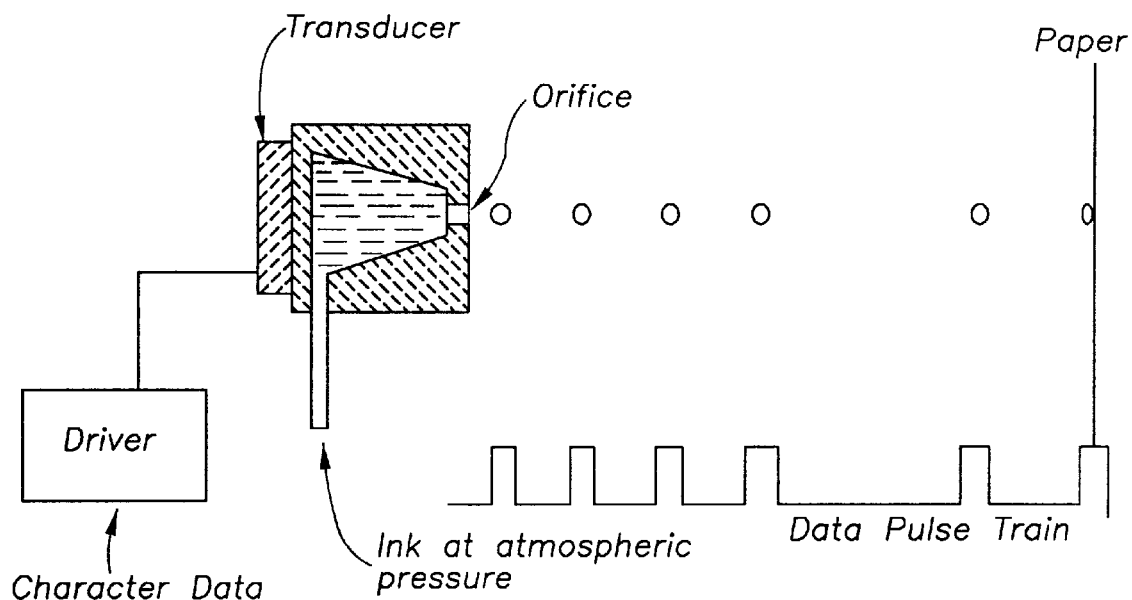
FIG. 1 is a schematic diagram illustrating the conventional digitally driven ejection device (ink-jet) having a reservoir in fluid communication with an ejection orifice with a transducer operating in drop-on-demand mode.

The present invention preferably utilizes drop-on-demand ink-jet technology. Piezoelectric based drop-on-demand ink-jet printing systems are illustrated schematically in FIG. 1. A volumetric change in the fluid within a printing device is induced by the application of a voltage pulse to a piezoelectric transducer which is coupled to the fluid. The volumetric change causes pressure/velocity transients to occur in the fluid which are directed to produce a drop from the orifice of the device. Here a voltage pulse is applied only when a drop is desired, as opposed to continuous ink-jet printers where droplets are continuously produced, but directed to the target substrate only when needed by a charge and deflect method. Further details about ink-jet printing systems and control apparatus are found in the U.S. Patents mentioned in the prior art section of the application which are incorporated herein by reference.

Figure 2A:
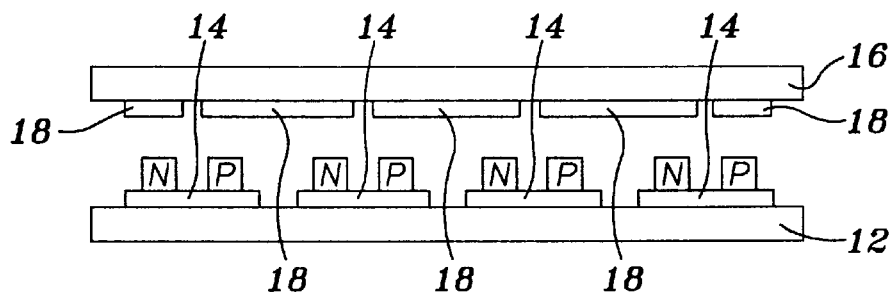
FIG. 2a is a schematic drawing illustrating a side view of a prior art thermoelectric cooler prior to final assembly.
Figure 2B:
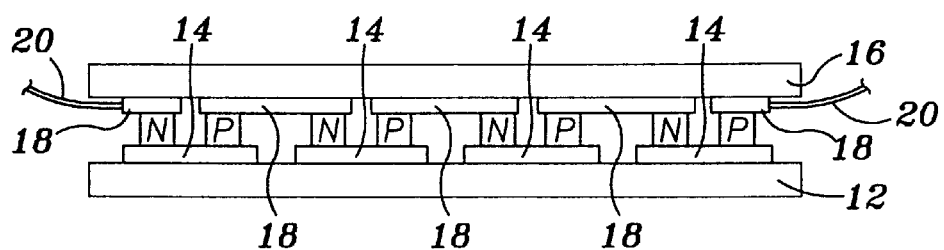
FIG. 2b is a side view drawing of the prior art thermoelectric cooler of FIG. 2a after final assembly.

FIGS. 2a and 2b illustrate the conventional prior art method of fabricating a thermoelectric cooler. In FIG. 2a, doped semiconductor materials (n and p-types) are assembled from pieces and fixed onto a non-conductive base substrate 12 (as a "N" or "P") utilizing metalized spaced apart conductive site pads 14. A non-conductive top substrate 16 is similarly provided with conductive bonding pads 18 produced by a metalization process but spaced differently than conductive site pads 14. Conductive bonding pads 18 may actually be the same size and spacing as the conductive site pads 14 on the base substrate 12 but are offset laterally to bridge a p-type chip on one conductive pad 14 and an n-type chip on an adjacent conductive pad 14. Conductive epoxy or solder (not shown) may be employed to proceed from the facing arrangement of substrates 12 and 16 in FIG. 2a to the completed thermoelectric cooler package in FIG. 2b. Leads 20 connect the outermost ones of the conductive pads as shown. When a voltage is applied to the leads 20, current flows alternately down through the n-type material and up through the p-type material to produce the thermal electric cooling effect. Copper metalization can be used for the pads 14 and 18 as long as it has a barrier layer to keep the copper ions from migrating into the semiconductor material. As mentioned before, the conventional n-type and p-type semiconductor materials are grown in crystal form and sawed into wafers, metalized and then machined into rectangular shapes as shown in FIGS. 2a and 2b, respectively.

An acceptable base semiconductor material is Bismuth Telluride, but other materials could be chosen such as: $(Bi\ Sb)_2(Te\ Se)_3$, Bismuth antimony alloys and $Bi_2Te_3$-X% $Bi_2Se_3$. N-type and p-type materials can be created from the base materials by either adding dopants or by changing the stoichiometry such as for Bismuth Telluride where a composition rich in Bismuth is p-type and a composition rich in Telluride is n-type. Solder is usually used to connect the n-type and p-type elements to the conductive metalization pads on the substrates 12 and 16. The substrates 12 and 16 are non-conductive ceramic like materials such as alumina.

Figure 3:
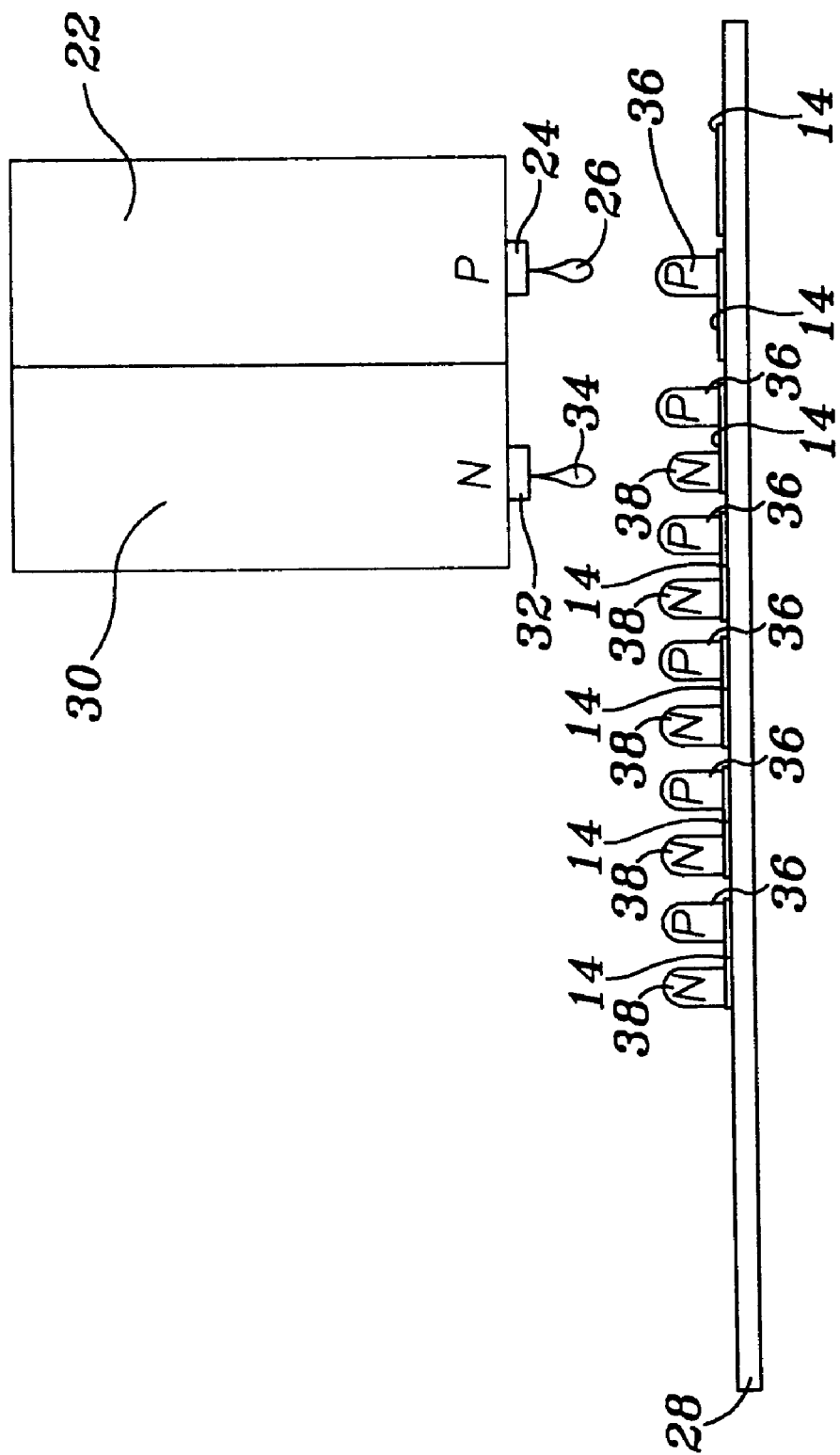
FIG. 3 illustrates the printing of both n-type and p-type thermoelectric semiconductor materials from digitally driven ejection devices onto spaced apart conductive site pads on a first non-conductive substrate.

FIG. 3 schematically outlines the process of the present invention wherein molten p-type semiconductor material is held in a digitally driven injection device 22 having a first ejection orifice 24. Droplets 26 are ejected from orifice 24 and directed toward one of a plurality of conductive site pads 14 which are spaced apart on a non-conductive first substrate 28. Molten n-type semiconductor material is held in a digitally driven ejection device 30 having a second ejection orifice 32 which ejects droplets of n-type semiconductor material 34. Ejection devices 22,30 may be separate devices or tied together in a spaced relationship to promote efficiencies when depositing materials. In FIG. 3, simultaneous deposits of n-type semiconductor material are being made on one conductive site pad 14 while p-type semiconductor material is deposited upon a different conductive site pad 14. Conductive site pads 14 are the same as conductive site pads 14, in FIGS. 2a and 2b, and subject to the same considerations. After the columns are formed on a given conductive site pad, it is necessary to move the substrate 28 relative to the printhead 22,30 by moving substrate 28 or by moving the printhead. The substrate is preferably mounted on an X-Y stage under control of a computer system which also operates the pulse signals that operate the ejection devices. The control system is preferably programmed to move the substrate 28 an amount that will position the appropriate ejection orifice 24,32 over the next conductive site pad 14 until all the semiconductor elements of the thermoelectric cooler are formed.

Columns 36 of p-type semiconductor material are produced by depositing from the first ejection orifice a series of droplets 26 of p-type semiconductor material onto a conductive site pad 14 on substrate 28, to freeze it in a column of p-type semiconductive material having a characteristic height and terminating at an end portion. The column 36 is produced by many, many of the droplets 26. As the droplets 26 freeze, the column grows in height. Similarly, droplets 34 of n-type semiconductive material are deposited from second ejection orifice 32 on to a conductive site pad 14 on the substrate to freeze them into a column 38 of n-type semiconductor material wherein columns 38 are spaced from the columns 36 of p-type semiconductor material on the same conductive site pad and have the same characteristic height and terminate at an end.

In the embodiment disclosed, each of the conductive site pads will have will have one n-type column 38 and one p-type column 36 which are spaced apart so that they do not touch. The space between the columns 36 and 38 is preferably about 50 percent of the diameter to ensure that they remain separate. The conditions necessary to produce the columns at equal height is material dependent. The process requires that the materials be "jettable" in molten form, which for the type of materials contemplated generally requires ejection devices which will operate at elevated temperature. Drop sizes and the number of drops must be adjusted to get the same column height in each of the columns 36, 38. Substrate 28 is preferably heated to a temperature which is below the freezing temperature of the particular n-type and p-type semiconductor material employed in the process. Once conditions are established, they can be repeated. It must be remembered that the printed column structures in question may have a height of only about 0.04 inches and a "diameter" of about 0.025 inches. The drawings are exaggerated for illustration.

Figure 4:
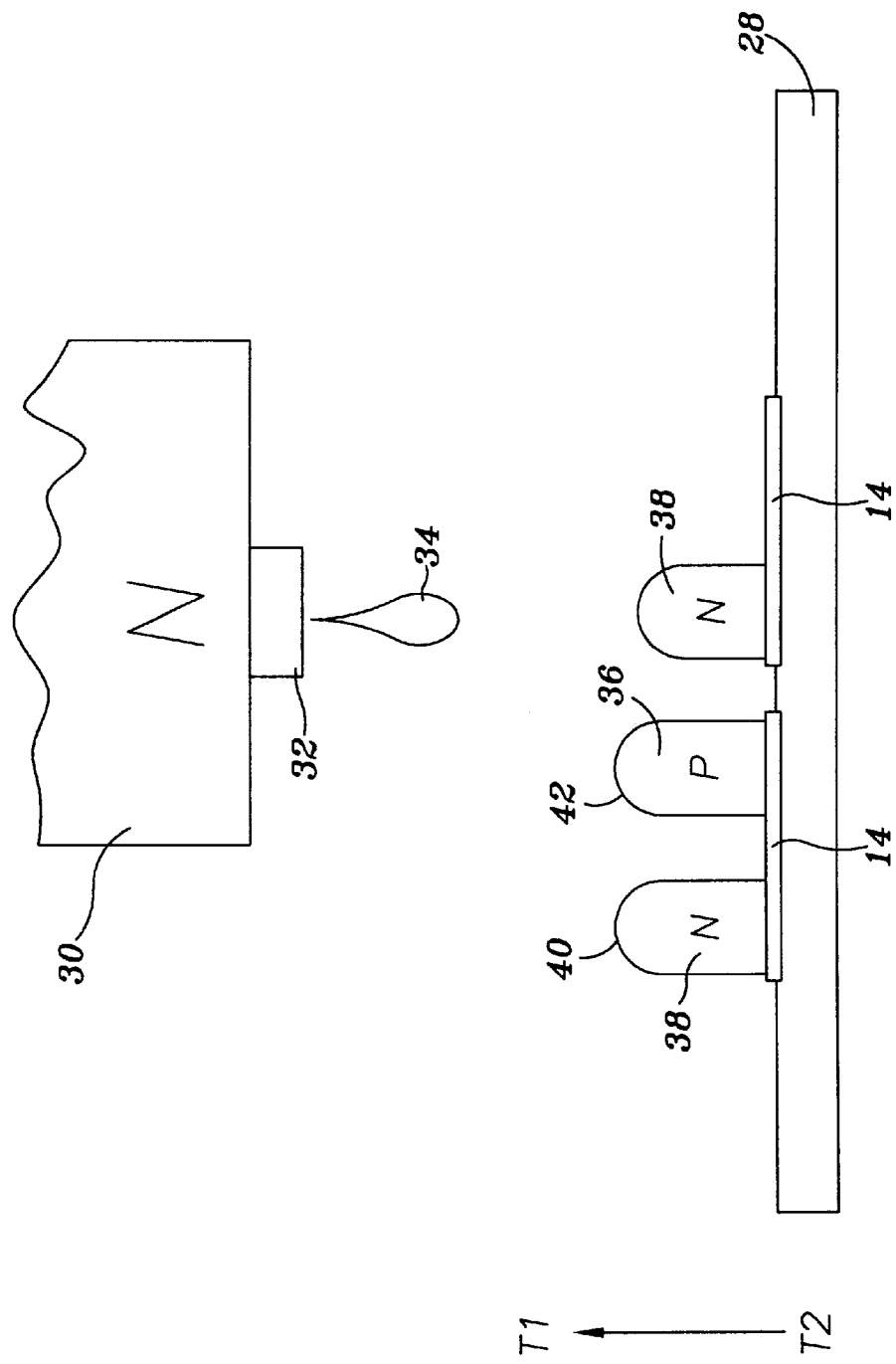
FIG. 4 is an enlargement of a portion of the apparatus of FIG. 3 illustrating n-type semiconductor material being deposited onto a second conductive site pad to freeze a column of the doped semiconductor material where the temperature T2 is less than a temperature T1.

FIG. 4 is a schematic drawing which should be considered as an enlarged view of a portion of FIG. 3 showing only the n-type digitally driven ejection device 30 forming a column of n-type semiconductor material on a second conductive site pad 14 after the completion of the formation of a column 38 of n-type material and a column 36 of p-type material on a first conductive site pad. Column 38 terminates in an end 40 and column 36 terminates in an end 42 where the ends 40, 42 are of the same characteristic height. After the n-type column 38 is formed on the second conductive site pad in FIG. 4, a p-type column 36 will be spaced apart from the column 36 as shown in the completed structure on the left hand side of FIG. 4. Substantial elevated temperature may be employed in order to melt the desired semiconductor materials. For example, for Bismuth Telluride, the jetting temperature must be above about 500 degrees C. and quartz is a suitable material for the device. A special droplet ejection device for extremely high temperatures will be explained in connection with the discussion of FIG. 6.

In FIG. 4, temperature is indicated by the gradient T2 to T1 shown by the arrow on the left side of the figure. The substrate 28 and conductive site pads 14 are preferably heated to a temperature T2, which is cooler than the jetting temperature, which is indicated as a temperature T1. When a droplet hits the surface it cools fastest near the surface with a temperature gradient extending vertically from the surface in the direction of the arrow. Crystal growth is in the direction normal to the surface which is the desired orientation for thermoelectric cooler devices. There is a tradeoff involved because crystal properties are probably better if the crystalization (freezing) occurs slowly but the process is faster if the droplets are deposited upon a cooler surface. It is desired that the droplets wet the conductive pads 14 so that they do not bounce off. Wetting is generally improved as substrate 28 is held at a higher temperature during the deposition process.

FIGS. 5a–5d illustrates a process according to the invention producing an array of thermoelectric cooler devices as shown in previous FIGS. 3 and 4. FIG. 5a illustrates a second non-conductive substrate referred to by the referenced numeral 16 because it is essentially the same as a substrate 16 in FIG. 1. It is provided with a plurality of spaced apart conductive bonding sites 18 which are preferably produced by metalization in the pattern illustrated in FIG. 5c. FIG. 5c illustrates the array of conductive bonding sites 18 spaced apart in a regular pattern on second non-conductive substrate 16. The outermost rows of conductive bonding sites 18 are connected by means of conductor strips 44 which connect them electrically and with leads 20 as shown.

FIG. 5b illustrates a first non-conductive substrate 28 having a plurality of conductive side pads 14 upon which are deposited columns of p-type semiconductor 36 and columns of n-type semiconductor material 38. The columns are produced and spaced as in FIG. 3. Each column 36, 38 in FIG. 5b has an end portion which is provided with a conductive bonding agent 46, in which a preferred embodiment is a conductive epoxy. Conductive epoxy 46 may also be deposited from a digitally controlled ejection device in a separate step of the process in order to provide a means for bonding the thermoelectric package being created. Alternately, the conductive bonding agent 46 may be deposited on the conductive bonding pads 18 on substrate 16 by the same digitally controlled ejection device, or both, to provide the bonding material to complete the thermoelectric package shown in FIG. 5e. Solder may also be used but it usually requires a metalization layer to be placed on the Bismuth Telluride materials. The conductive epoxy 46 can also be screen printed onto the conductive bonding sites 18 prior to assembly.

FIG. 5d shows the structure of 5b looking down on the tops of columns 36, 38 which are arranged in the array. It can be seen that the top structure in FIG. 5c and the bottom structure in FIG. 5d are arranged in a spacing that will connect the columns into a thermoelectric array seen in end view in FIG. 5e. After the two halves of the structure are put together as indicated, the conductive bonding agent 46, preferably a conductive epoxy, is hardened by curing with heat or ultra violet light as the case may be. If solder is used then the structure must be placed in a heating device and heated to a temperature that will allow the solder to flow to make a bond before freezing it to fix the structure in place.

In this particular arrangement, when assembled as in FIG. 5e each of the outer columns of n-type semiconductor material 38 are connected to a lead 20 through conductor 44 and each of the outer columns of p-type semiconductor material 36 are connected to the other lead 20 through the conductor 44 on the opposite side. The middle set of conductive bonding pads 18 in FIG. 5c bridge a column of p-type semiconductor material 36 on one conductive site pad 14 and n-type semiconductor material on an adjacent conductive site pad 14.

Therefore, in this arrangement current can flow alternately down through the columns of n-type material 38 and up through the columns of p-type material 36 to form a thermoelectric cooler where the individual rows running laterally are connected in parallel. Many other arrangements are possible to produce many other numbers of site pads in columns with connections in different ways known to one of ordinary skill in the art.

Figure 6:
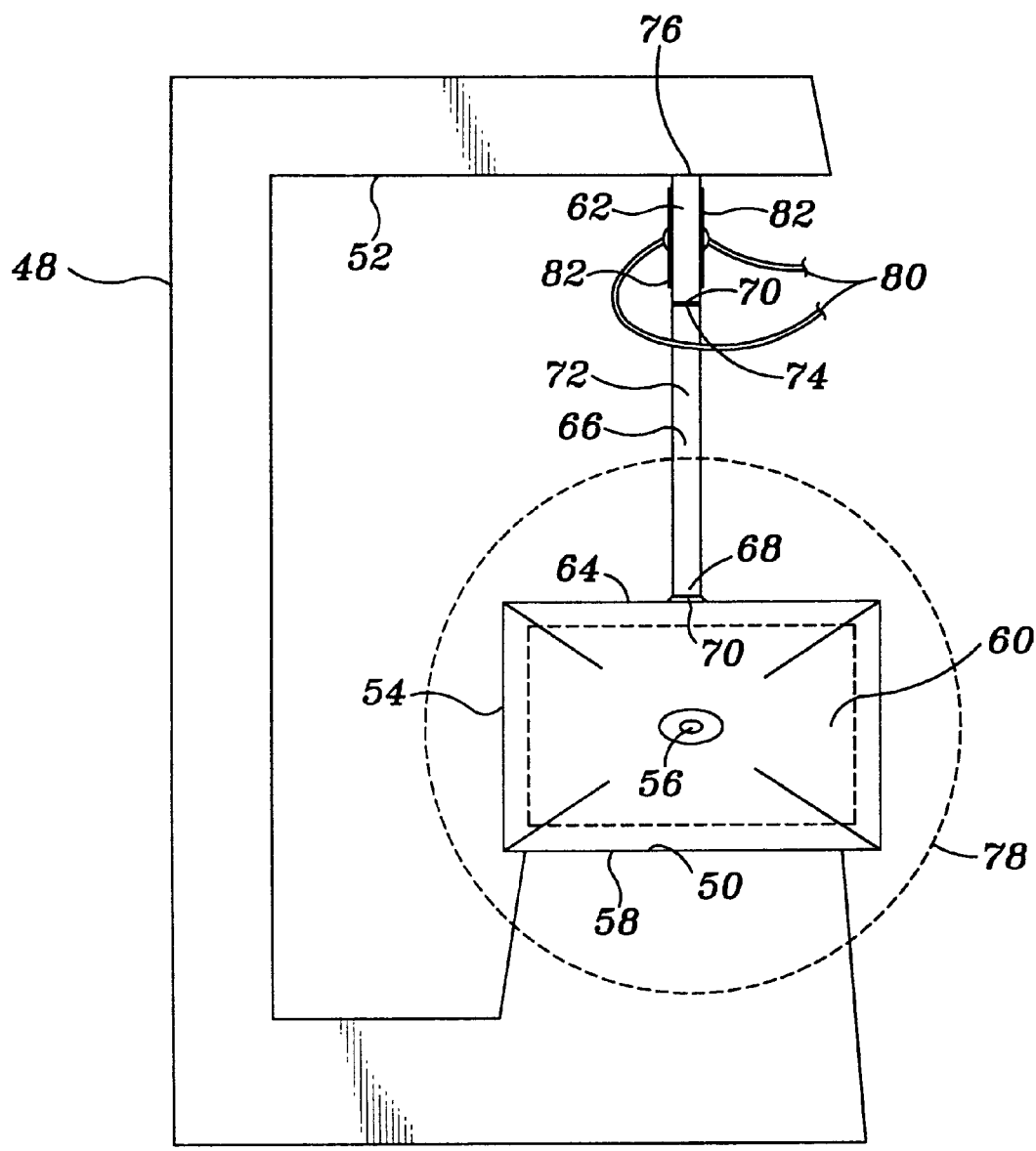
FIG. 6 is a schematic diagram illustrating a high-temperature digitally driven ejection device where the fluid containing reservoir is at least partially thermally isolated from the piezoelectric operating device.

FIG. 6 is a schematic representation of a printhead configuration capable of going to very high temperatures for use with this invention. It employs a fixture 48 having spaced apart opposing support surfaces 50, 52. A flat sided capillary tube 54, having an orifice 56 at one end is at least partly supportingly disposed on support surface 50 of fixture 48.

The flat sided capillary tube 54 is an elongated tube. Its length extends perpendicular to the plane of the paper in FIG. 6. One flat side 58 is supported on surface 50 wherein surfaces 50 and 52 are also elongated surfaces. The interior of capillary tube 54 comprises an elongated fluid chamber 60 which may be a self contained chamber or it can be supplied from a connected heated reservoir. Chamber 60 will contain a molten semiconductor fluid to be dispensed from capillary tube 54 through orifice 56. An elongated strip of piezoelectric material 62, elongated in the direction of the paper, is coupled between the upper flat side 64 of capillary tube 54 and the upper support surface 52 of fixture 48 by means of a stand-off strip portion 66 which also extends into the plane of the paper. The lower end 68 of stand-off 66 is preferably adhesively connected along its lower edge by means of adhesive 70. Its upper end 72 is preferably connected by means of adhesive 70 to the lower edge 74 of piezoelectric strip 62. Upper edge 76 of piezoelectric strip 62 is preferably joined to surface 52 by means of another band of adhesive 70. The dotted circle 78 represents a furnace or heating chamber or some means to heat the ejection device to a temperature sufficient to melt and fluidize n-type and p-type semiconductor materials to a viscosity preferably below about 100 centipoise at the jetting temperature in order to operate in drop-on-demand mode. The melted semiconductor fluid in the chamber 60 must not react with the walls of the flat sided capillary tube. A pair of electrodes 80 are connected to conductive coatings 82 running down the length of piezoelectric strip 62 to supply the digital voltage pulses necessary to activate piezoelectric strip 62 in order to dispense droplets of fluid from orifice 56. Standoff strip 66 should be considered inert as far as voltage pulses and activity are concerned. It merely serves to transmit mechanical distortions produced in piezoelectric strip 62 by voltage pulses from electrodes 80 into mechanical distortions of flat-sided capillary tube 54. Stand-off strip 66 might preferably be a non-conductor of heat so that excessive heat is not transmitted to piezoelectric strip, 62 as it is known that excessive temperature can result in degradation of the piezoelectric material. Piezoelectric material is "poled" by applying a voltage over time and at an elevated temperature. If it is exposed to too high a temperature, it can be "de-poled" and thus rendered unusable. Therefore, this arrangement allows a digitally operated piezoelectric dispensing device to operate at elevated temperatures without exposing the actual piezoelectric material in strip 62 to those elevated temperatures. Further details of the device in FIG. 6 and similar such devices is disclosed in U.S. pat. application Ser. Nos. 09/514760, filed Feb. 28, 2000, entitled Flat Sided Fluid Dispensing Device, by the Assignee of the present application which is incorporated herein by reference.

Although the invention has been disclosed above with regard to a particular and preferred embodiment, it is not intended to limit the scope of the invention. For instance, although the inventive method has been set forth in a prescribed sequence of steps, it is understood that the disclosed sequence of steps may be varied. It will be appreciated that various modifications, alternatives, variations, etc., may be made without departing from the spirit and scope of the invention as defined in the appended claims.

I claim:

1. A method of fabricating thermoelectric coolers from molten components, comprising:

providing a plurality of spaced apart conductive site pads on a first substrate;

holding molten p-type semiconductor material in a digitally driven ejection device having a reservoir in fluid communication with a first ejection orifice;

holding molten n-type semiconductor material in a digitally driven ejection device having a reservoir in fluid communication with a second ejection orifice;

holding the first substrate at a crystallization temperature lower than the temperature of the molten semiconductor materials;

depositing from the first ejection orifice a series of droplets of p-type semiconductor material onto a first conductive site pad on the substrate to freeze it in a column extending away from the first conductive site pad and having a characteristic height terminating at an end; and depositing from the second ejection orifice a series of droplets of n-type semiconductor material onto the first conductive site pad on the substrate, to freeze it in a column spaced from the column of p-type semiconductor material and extending away from the first conductive site pad and having the same characteristic height terminating at an end.

2. The method of claim 1 further including the step of positioning at least a second conductive site pad under the first and second ejection orifices and repeating the steps of depositing droplets of p-type semiconductor material and n-type semiconductor material to form a separate column of p-type semiconductor material and separate column of n-type semiconductor material spaced apart and extending away from the at least a second conductive site pad and having the same characteristic height each terminating at an end.

3. The method of claim 2 further including the steps of:
providing a second substrate having a plurality of spaced apart conductive bonding sites including a first conductive bonding site;
placing the first and second substrates in facing relation, with the first conductive bonding site mated with one of a column of p-type or n-type semiconductor material on the first conductive site pad and the first conductive bonding site mated with the other of a column of n-type or p-type semiconductive material on the second conductive site pad; and
bonding the mated columns of p-type and n-type semiconductor material in electrical contact with the mated first conductive bonding site to create a package capable of acting as a thermoelectric cooler.

4. The method of claim 3 wherein the step of placing the first and second substrates in facing relation is preceded by the step of applying a conductive bonding agent to the end of the columns of semiconductor material on the first conductive site pad and the end of the columns of semiconductor material on the second conductive site pad.

5. The method of claim 4 wherein the step of applying a conductive bonding agent to the columns of p-type and n-type semiconductor material is the step of applying a conductive epoxy to the ends of the p-type and n-type columns of semiconductor material and the bonding step includes the steps of distorting the conductive epoxy and curing the distorted epoxy to secure the first and second substrates into said package capable of acting as a thermoelectric cooler.

6. The method of claim 3 wherein the step of placing the first and second substrates in facing relation is preceded by the step of applying a conductive bonding agent to the conductive bonding sites.

7. The method of claim 6 wherein the step of applying a conductive bonding agent to the conductive bonding sites is the step of applying a conductive epoxy and the bonding step is accompanied by the steps of distorting the conductive epoxy and curing the distorted epoxy to secure the first and second substrates into said package capable of acting as a thermoelectric cooler.

8. The method of claim 1 wherein the step of depositing p-type and the step of depositing n-type semiconductor material is accompanied by the step of controlling the first and second ejection devices to deposit volumetric equivalent amounts of p-type and n-type semiconductor materials in order to freeze columns of p-type and n-type semiconductor material having the same characteristic height.

9. A method of fabricating thermoelectric coolers from molten components, comprising:
providing a first non-conductive substrate having a plurality of spaced apart conductive site pads;
holding one of molten p-type or n-type semiconductor material having a higher freezing temperature in a digitally driven droplet ejection device having a heated reservoir in fluid communication with a first ejection orifice;
holding the first non-conductive substrate at a crystallization temperature which is lower than the freezing temperature of the molten semiconductor material having the higher freezing temperature;
forming a column of semiconductor material on each of the plurality of spaced apart conductive site pads on the first non-conductive substrate by depositing droplets of the higher freezing temperature semiconductor material thereon from the first ejection orifice, each column terminating at an end portion and having the same characteristic height;
holding the other of molten n-type or p-type semiconductor material in a digitally driven droplet ejection device having a heated reservoir in fluid communication with a second ejection orifice;
holding the first non-conductive substrate at a crystallization temperature which is lower than the freezing temperature of the other of said n-type or p-type semiconductor material;
forming a separate column of semiconductor material on each of the plurality of spaced apart conductive site pads on the first non-conductive substrate by depositing droplets of the lower freezing temperature semiconductor material thereon from the second ejection orifice, each column terminating at an end portion and having the same characteristic height as the already formed columns of semiconductor material.

10. The method of claim 9 further including the steps of:
providing a second non-conductive substrate having at least a plurality of conductive bonding sites spaced to provide an electrical connection between a column of p-type or n-type semiconductor material on one conductive site pad and a column of n-type or p-type semiconductor material on a different conductive site pad on the first non-conductive substrate;
placing the first and second non-conductive substrates in facing relation with one of the plurality conductive bonding sites mated with a column of p-type semiconductor material on said one conductive site pad and a column of n-type semiconductor material on said different conductive site pad;
bonding the mated columns of p-type and n-type semiconductor material in electrical contact with said one of the plurality of conductive bonding sites to create a package capable of acting as a thermoelectric cooler.

11. The method of claim 10 wherein the bonding step is preceded by the step of applying a conductive bonding agent to said columns of p-type and n-type semiconducting material prior to the step of placing the first and second non-conductive substrates in facing relation.

12. The method of claim 11 wherein the step of applying a conductive bonding agent comprises a step of applying a conductive epoxy and the bonding step further comprises the step of curing the conductive epoxy.

13. The method of claim 11 wherein the step of applying a conductive bonding agent comprises a step of applying solder to said columns of p-type and n-type semiconductor material and the bonding step further comprises a step of melting and refreezing the solder to create the package capable of acting as a thermoelectric cooler.

14. The method of claim 10 wherein the bonding step is preceded by the step of applying a conductive bonding agent to said one of the plurality of conductive bonding sites that is mated with the end portions of the p-type and n-type semiconductor materials prior to the step of placing the first and second non-conductive substrates in facing relation.

15. The method of claim 11 wherein the step of applying a conductive bonding agent comprises a step of applying a conductive epoxy and the bonding step further comprises a step of curing the conductive epoxy.

16. The method of claim 11 wherein the step of applying a conductive bonding agent comprises applying solder to said one of the plurality of conductive bonding sites mated with the end portions of the p-type and n-type semiconductor materials and the bonding step includes a step of melting and refreezing the solder to create said package capable of acting as a thermal electric cooler.

17. A method of fabricating thermoelectric coolers from molten components, comprising:

providing an array of spaced apart conductive site pads on a first non-conductive substrate;

holding molten p-type semiconductor material in a digitally driven first ejection device having a reservoir in fluid communication with a first ejection orifice;

holding molten n-type semiconductor material in a digitally driven second ejection device having a reservoir in fluid communication with a second ejection orifice;

holding the substrate at a crystallization temperature lower than the temperature of the molten semiconductor materials wherein droplets of the p-type and n-type semiconductor materials deposited on the first non-conductive substrate will freeze in columns extending away from the substrate;

forming a column of p-type semiconductor material on each of a plurality of adjacent conductive site pads on the first non-conductive substrate by depositing droplets of p-type semiconductor material thereon from the first ejection orifice;

forming a separate column of n-type semiconductor material on each of the same plurality of adjacent conductive site pads on the first non-conductive substrate by depositing droplets of n-type semiconductor material thereon from the second ejection orifice; and wherein the columns of p-type and n-type semiconductor material formed on the plurality of conductive site pads are separated columns of about the same length, each column terminating at an end portion.

18. The method of claim 17 further including the step of applying a conductive bonding agent to the end portion of each of the columns of p-type and n-type semiconductor material.

19. The method of claim 18 further including the steps of:

providing a second non-conductive substrate having an array of spaced apart conductive bonding sites configured to bridge, on each of the plurality of adjacent conductive site pads, a column of p-type semiconductor material on one conductive site pad and a column of n-type semiconductor material on the adjacent conductive site pad;

placing the first and second non-conductive substrates in facing relation wherein conductive bonding sites resting on the ends of the columns of semiconductor material each bridge a p-type column of semiconductor material on one conductive site pad and an n-type column of semiconductor material on the adjacent conductive site pad of the plurality of conductive site pads on the first non-conductive substrate;

bonding the conductive bonding sites to the ends of said columns of p-type and n-type semiconductor material of the plurality of conductive site pads to create an electrically connected package capable of acting as a thermoelectric cooler.

20. The method of claim 19 wherein the step of applying a conductive bonding agent to the ends of the columns of p-type and n-type semiconductor material comprises the step of applying a conductive epoxy to the ends of the columns of p-type and n-type semiconductor material and the bonding step is accompanied by the steps of distorting the conductive epoxy and curing the distorted epoxy to secure the first and second non-conductive substrates into said package capable of acting as a thermoelectric cooler.

21. The method of claim 19 wherein the step of applying a conductive bonding agent to the ends of each of the columns of p-type and n-type semiconductor material is accomplished by the step of first applying the conductive bonding agent to the conductive bonding sites and transferring conductive bonding agent to the ends of the columns of p-type and n-type material when said first and second non-conducting substrates are placed together in facing relation.

22. The method of claim 17 wherein the step of forming columns of p-type and n-type semiconductor materials on the plurality of adjacent conductive site pads is accompanied by the step of controlling the first and second ejection devices to deposit volumetric equivalent amounts of p-type and n-type semiconductor material in order to freeze columns of p-type and n-type semiconductor material having the same characteristic height.

* * * * *